(12) United States Patent
Im

(10) Patent No.: US 7,609,566 B2
(45) Date of Patent: Oct. 27, 2009

(54) SEMICONDUCTOR MEMORY DEVICE

(75) Inventor: Jae-Hyuk Im, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 80 days.

(21) Appl. No.: 11/819,804

(22) Filed: Jun. 29, 2007

(65) Prior Publication Data

US 2008/0158945 A1  Jul. 3, 2008

(30) Foreign Application Priority Data

Jan. 3, 2007 (KR) .......................... 2007-0000409

(51) Int. Cl.
*G11C 5/14* (2006.01)
*G11C 7/00* (2006.01)
*G11C 8/00* (2006.01)

(52) U.S. Cl. .................... 365/189.09; 365/189.19; 365/222; 365/233.1

(58) Field of Classification Search ............ 365/189.09, 365/189.19, 222
See application file for complete search history.

(56) References Cited

U.S. PATENT DOCUMENTS 5,920,226 A * 7/1999 Mimura ..................... 327/537
6,760,806 B2   7/2004 Jeon
6,950,364 B2   9/2005 Kim
6,992,943 B2   1/2006 Hwang et al.
2004/0100847 A1   5/2004 Derner et al.
2005/0270874 A1  12/2005 Hur et al.
2006/0104316 A1   5/2006 Kitamori et al.
2006/0114731 A1*  6/2006 Park et al. ............. 365/189.09

FOREIGN PATENT DOCUMENTS

KR          100231602 B1   11/1999
KR     10-2005-0106410 A   11/2005

OTHER PUBLICATIONS

Korean Office Action issued in Patent Application No. 10-2007-0000409 dated on Jul. 9, 2008.

* cited by examiner

*Primary Examiner*—Ly D Pham
(74) *Attorney, Agent, or Firm*—IP & T Law Firm PLC

(57) ABSTRACT

A semiconductor memory device includes a charge pumping circuit, a level sensor, an oscillator, and a pumping control signal generator. The charge pumping circuit performs a negative-pumping operation to an external power in order to generate an internal voltage having a level lower than the external power. The level sensor senses a level of the internal voltage corresponding to a level of an adjusted reference voltage during a refresh mode. The oscillator generates a period signal in response to a sensing signal of the level sensor. The pumping control signal generator controls the operation of the charge pumping circuit in response to the period signal.

9 Claims, 9 Drawing Sheets

SEMICONDUCTOR MEMORY DEVICE

CROSS-REFERENCE TO RELATED APPLICATION

The present invention claims priority of Korean patent application number 10-2007-0000409, filed on Jan. 3, 2007, which is incorporated by reference in its entirety.

BACKGROUND OF THE INVENTION

The present invention relates to semiconductor design technologies; and, more particularly, to a semiconductor memory device which is provided with an internal power generator capable of increasing a cell retention time during a self refresh mode and a refresh unit capable of minimizing power consumption by adjusting a refresh period depending on a level of an internal power.

Generally, basic operations of a semiconductor memory device include a write operation for storing data provided from outside and a read operation for outputting desired data stored therein upon requests from the outside. In order to perform these write and read operations, the semiconductor memory device requires the capability of storing data from the outside.

In particular, since DRAM (Dynamic Random Access Memory) is a nonvolatile memory, data stored therein is lost after a fixed amount of time elapses. Therefore, a refresh operation is needed to fully restore data stored in memory cells before the fixed amount of time in order to prevent the loss of data. This refresh operation has priority over any other operations in DRAM.

Such a refresh operation is done at a fixed period that is closely concerned with a retention time of cell data. More details on this will be given below with reference to a circuit and a cross-sectional view of unit memory cell.

FIG. 1A is a conceptual circuit diagram of unit memory cell of a conventional DRAM. For reference, the unit memory cell denotes a space where 1 bit data is stored.

Referring to FIG. 1A, the unit memory cell is provided with a capacitor C1 for storing data and an NMOS transistor NM1 for accessing the capacitor.

To be more specific, a word line WL is connected to a gate of the NMOS transistor NM1. And, a bit line BL is connected to one side active region (here, a drain) of the NMOS transistor NM1 and the cell capacitor to other side active region (here, a source) thereof.

FIG. 1B is a cross-sectional view of the unit memory cell of FIG. 1A, and particularly shows a leakage current generated in the unit memory cell.

As shown in FIG. 1B, although the transistor is turned off, a leakage current occurs in the cell capacitor (here, it is assumed that a logic high data is stored in the cell capacitor). Two major factors of the leakage current are an off current $I_{OFF}$ and a junction current $I_{JUN}$. Meanwhile, an internal power VBB with a negative electric potential lower than a ground voltage is generally connected to a bulk of the NMOS transistor in the unit memory cell shown in FIG. 1A. By keeping the bulk bias low like this, the leakage current as shown in FIG. 1B is reduced by setting a threshold voltage of the transistor higher than that of a general NMOS. But, as the level of the internal power VBB becomes lower, the threshold voltage becomes higher to decrease off-current, while rather increasing the leakage current by a elevation of the junction-current $I_{JUN}$. That is, the off-current $I_{OFF}$ and the junction-current $I_{JUN}$ constituting the leakage current have a trade-off relationship depending on the level of the internal power VBB. Therefore, in order to extend a retention time of cell data, it is important to find an optimal level of the internal power VBB making both the off-current $I_{OFF}$ and the junction-current $I_{JUN}$ smaller.

The following is a description for a conventional internal power generator for generating an internal power VBB to be applied to a bulk end of cell and a refresh unit for refreshing cell data.

FIG. 2 is a block diagram showing a configuration of a conventional internal power generator.

Referring to FIG. 2, the conventional internal power generator includes a charge pumping circuit 40 for negative-pumping an external power VDD to generate an internal power VBB with a level lower than the external power VDD, a reference voltage generator 50 for producing a reference voltage VINT_BB, a level sensor 10 for sensing a level of the internal power VBB on the basis of the reference voltage VINT_BB, an oscillator 20 for generating a period signal OSC in response to a sensing signal BBE of the level sensor 10, and a pumping control signal generator 30 for controlling the operation of the charge pumping circuit 40 in response to the period signal OSC.

The reference voltage generator 50 is provided with a voltage generator 52 for generating a target voltage of the internal power VBB and a level shifter 54 for level-shifting an output voltage VREF of the voltage generator 52 to generate the reference voltage VINT_BB having a stable level regardless of the external power VDD (or power supply voltage).

FIG. 3 illustrates an internal circuit diagram of the level sensor 10 of FIG. 2.

Referring to FIG. 3, the level sensor 10 is composed of a voltage divider 12 for voltage-dividing a level difference between the ground voltage VSS and the reference voltage VINT_BB by a level difference between the ground voltage VSS and the internal power VBB, an inverter 14 for taking the reference voltage VINT_BB and the ground voltage VSS as driving powers and inverting and outputting an output voltage of the voltage divider 12, a differential amplifier 16 taking an output voltage of the inverter 14 and an inverted voltage of the output of the inverter 14 as differential inputs, and an inverter I1 for inverting an output voltage of the differential amplifier 16 to provide an inverted voltage as the sensing signal BBE.

Hereinafter, the operation of the internal power generator shown in FIGS. 2 and 3 will be briefly described.

First, the level sensor 10 senses a level of the feedbacked internal power VBB on the basis of the reference voltage VINT_BB. At this time, when the level of the internal power VBB is higher than the reference voltage VINT_BB and the output voltage of the voltage divider 12 exceeds a logic threshold voltage of the inverter 14, the sensing signal BBE is activated to a logic high level.

Then, the oscillator 20 is activated by the sensing signal BBE to create the period signal OSC. In response to the period signal OSC, the pumping control signal generator 30 drives the charge pumping circuit 40, which causes the level of the internal power VBB to drop.

When the level of the internal power VBB drops, the output voltage of the voltage divider 12 becomes lower than the logic threshold voltage of the inverter 14 which makes the sensing signal BBE inactivated to a logic low level.

Thus, the operations of the oscillator 20, the pumping control signal generator 30 and the charge pumping circuit 40 are deactivated.

As described above, the internal power generator in the conventional semiconductor memory device is driven to maintain the internal power VBB at a level corresponding to the target level of the reference voltage. Here, as mentioned above, the level of the reference voltage is set such that the operation such as storage of data in write operation or restoration of data in read operation can be made within a designated time, while securing the retention time of data by reduction in leakage current. For reference, in order to secure the retention time of data, it is preferred that the level of the internal power VBB is as low as possible. But, if the level of the internal power VBB becomes lower, the threshold voltage becomes higher, which prolongs the operation time of data storage or restoration.

However, the conventional internal power generator is driven without considering IDD6 circumstance capable of securing a greater margin than an active mode as a driving time for restoration of data. That is, it was impossible to control the retention time of cell data to be extended for the refresh interval.

For reference, the IDD6 circumstance is a mode that enters when the clock enable signal CLK is transited to a logic low level and again stores all cells by performing 8K number of times of refreshes for 64 ms.

FIG. 4 is a block diagram showing a configuration of a refresh unit included in the conventional semiconductor memory device.

Referring to FIG. 4, the conventional refresh unit includes a mode input/output controller 60 for accepting a clock enable signal CKE and an auto refresh command AREF_CMD and generating an internal auto refresh signal AREFP, a self refresh entry signal SREF_EN and a self refresh escape signal SREF_EXP, a refresh interval signal generator 70 for generating a self refresh interval signal SREF notifying a self refresh interval by using the internal auto refresh signal AREFP, the self refresh entry signal SREF_EN and the self refresh escape signal SREF_EXP, a refresh period signal generator 80 for periodically outputting a period-pulse signal PL_FLG during activation of the self refresh interval signal SREF, an internal refresh signal generator 90 for activating an internal refresh signal REFP in response to the internal auto refresh signal AREFP and the period-pulse signal PL_FLG, and an internal address counter 95 for increasing a row address by one bit unit in response to the internal refresh signal REFP to output an internal address RCNTI[0:N].

For reference, the clock enable signal CKE is a signal representing whether a clock synchronizing the operation of the semiconductor memory device is valid or not. Thus, if only the clock enable signal CKE is inactivated, the semiconductor memory device enters a power-down mode for minimizing its own power consumption.

FIG. 5 shows an internal circuit diagram of the refresh period signal generator 80 of FIG. 4.

Referring to FIG. 5, the refresh period signal generator 80 includes an oscillator 82 which has an inverter chain and is active upon activation of the self refresh interval signal SREF to generate a signal OSC_OUT at regular intervals, and a pulse generator 84 for producing the period-pulse signal PL_FLG of pulse type from the output signal OSC_OUT of the oscillator 82.

In brief operation, first of all, when the self refresh interval signal SREF is activated to a logic high level, the oscillator 82 generates the signal OSC_OUT at a regular interval. Here, the regular intervals are determined based on the voltage levels of signals applied to the gates ends of NMOS transistors and PMOS transistors constituting the inverter chain. Next, the pulse generator 84 senses a rising edge of the output signal OSC_OUT of the oscillator 82, and generates the period-pulse signal PL_FLG of a pulse type.

FIG. 6 presents an operational waveform diagram of the refresh unit according to the prior art shown in FIGS. 4 and 5.

As shown in FIG. 6, the clock enable signal CKE is first transited to a logic low level and at the same time a auto refresh command AREF_CMD is activated. Then, the mode input/output controller 60 activates the self refresh entry signal SREF_EN in response to the logic level transition of the clock enable signal CKE and activates the internal auto refresh signal AREFP in response to an auto refresh command AR.

Next, the internal refresh signal generator 90 generates the internal refresh signal REFP in response to the internal auto refresh signal AREFP. In succession, the internal address counter 95 increases the row address by one bit unit whenever the internal refresh signal REFP is activated, to output the internal address RCNTI[0:N].

Further, the refresh interval signal generator 70 activates the self refresh interval signal SREF in response to activation of the internal auto refresh signal AREFP and the self refresh entry signal SREF_EN, wherein this activation is maintained until the self refresh escape signal SREF_EXP is applied.

Subsequently, the refresh period signal generator 80 periodically activates the period-pulse signal PL_FLG during the activation of the self refresh interval signal SREF. And then, the internal refresh signal generator 90 activates a new internal refresh signal REFP of a pulse type whenever the period-pulse signal PL_FLG is applied. Lastly, the internal address generator 95 increases the row address by one bit unit whenever the internal refresh signal REFP is activated, to output the internal address RCNTI[0:N].

For reference, the internal refresh signal REFP is applied to each bank, which makes a word line corresponding to the internal address RCNTI[0:N] active to perform a self refresh.

Meanwhile, the refresh period by the refresh unit in the conventional semiconductor memory device is determined by the period of the period-pulse signal PL_FLG. The period-pulse signal PL_FLG is generated at a regular period, regardless of the level of the internal power VBB. Therefore, although the level of the internal power VBB is optimized so that the retention time is reduced, it is unlikely to reflect the above. This reduces the number of times of refresh and thus cannot decrease power consumption.

Therefore, the conventional semiconductor memory device does not adjust the level of the internal power under the self refresh mode, thereby making it impossible to adjust the retention time of cell data. Also, the refresh unit cannot be driven appropriately according to the retention time.

SUMMARY OF THE INVENTION

Embodiments of the present invention are directed to providing a semiconductor memory device for reducing a current consumption by adjusting a refresh period according to a bulk voltage level.

In accordance with an aspect of the present invention, there is provided a semiconductor memory device including a charge pumping circuit, a level sensor, an oscillator, and a pumping control signal generator. The charge pumping circuit performs a negative-pumping operation to an external power in order to generate an internal voltage having a level lower than the external power. The level sensor senses a level of the internal voltage corresponding to a level of an adjusted reference voltage during a refresh mode. The oscillator generates a period signal in response to a sensing signal of the level sensor. The pumping control signal generator controls the operation of the charge pumping circuit in response to the period signal.

In accordance with another aspect of the present invention, there is provided a driving method of a semiconductor memory device including performing a negative-pumping operation to an external power in order to generate a bulk voltage of memory cell; sensing a level of the bulk voltage in response to a reference voltage; and controlling the negative-pumping operation so that the bulk voltage has a level corresponding to the reference voltage. The reference voltage has different voltage levels for a self refresh mode and a normal mode.

In accordance with another aspect of the present invention, there is provided a semiconductor memory device including a refresh exit/entry controller and a control signal generator. The refresh-exit/entry controller receives a clock enable signal and an auto refresh command and generates a self refresh interval signal notifying that the current operation is in a self refresh mode. The control signal generator periodically generates an internal refresh signal and an internal address for refresh driving during activation of the self refresh interval signal. An activation period of the internal refresh signal is adjusted according to a level of a bulk voltage applied to a memory cell.

In accordance with still another aspect of the present invention, there is provided a driving method of a semiconductor memory device, including operating the semiconductor memory device in a self refresh mode by activating a self refresh interval signal in response to a clock enable signal and an auto refresh command; and generating an internal refresh signal and an internal address for controlling a refresh driving at predetermined intervals during an activation of the self refresh interval signal. The self refresh interval signal notifies that a current operation is performed in the self refresh mode. The predetermined intervals are adjusted according to a level of a bulk voltage applied to a memory cell.

In accordance with still another aspect of the present invention, there is provided a semiconductor memory device, including an internal power generator, a refresh unit, a level controller, a period adjustor. The internal power generator performs a negative-pumping operation to an external power in order to generate a bulk voltage to be applied to a bulk end of cell. The refresh unit generates an internal refresh signal for refresh driving at regular intervals during a self refresh mode. The level controller controls a level of the bulk voltage in the self refresh mode. The period adjustor adjusts the regular intervals when the level controller is driven.

DESCRIPTION OF SPECIFIC EMBODIMENTS

Hereinafter, preferred embodiments of the present invention will be described in detail with reference to the accompanying drawings so that the invention can be easily carried out by those skilled in the art.

Figure 1A:
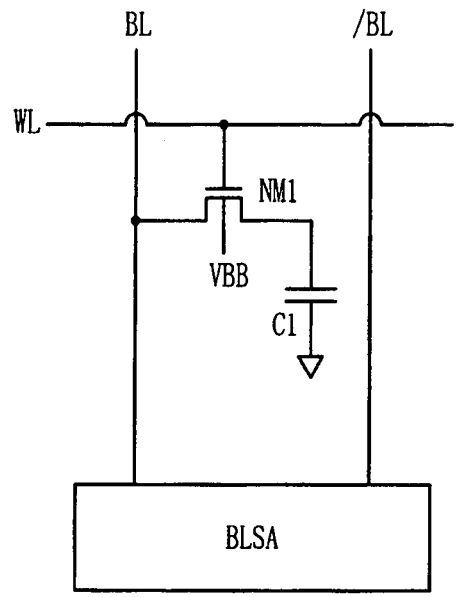
FIG. 1A is a conceptual circuit diagram of unit memory cell of a conventional DRAM.
Figure 1B:
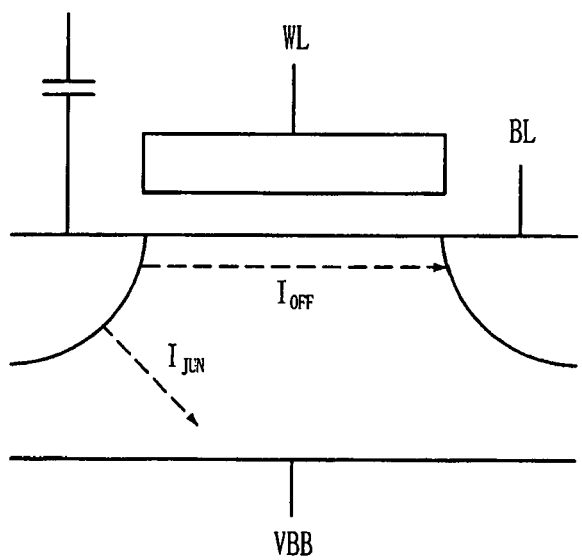
FIG. 1B is a cross-sectional view of the unit memory cell of FIG. 1A, and particularly shows a leakage current generated in the unit memory cell.
Figure 2:
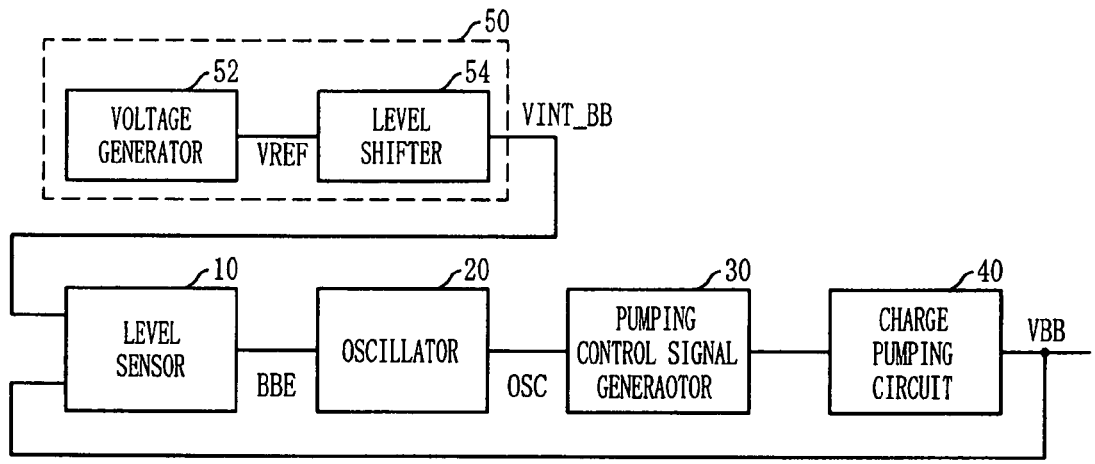
FIG. 2 is a block diagram showing a configuration of a conventional internal power generator.
Figure 3:
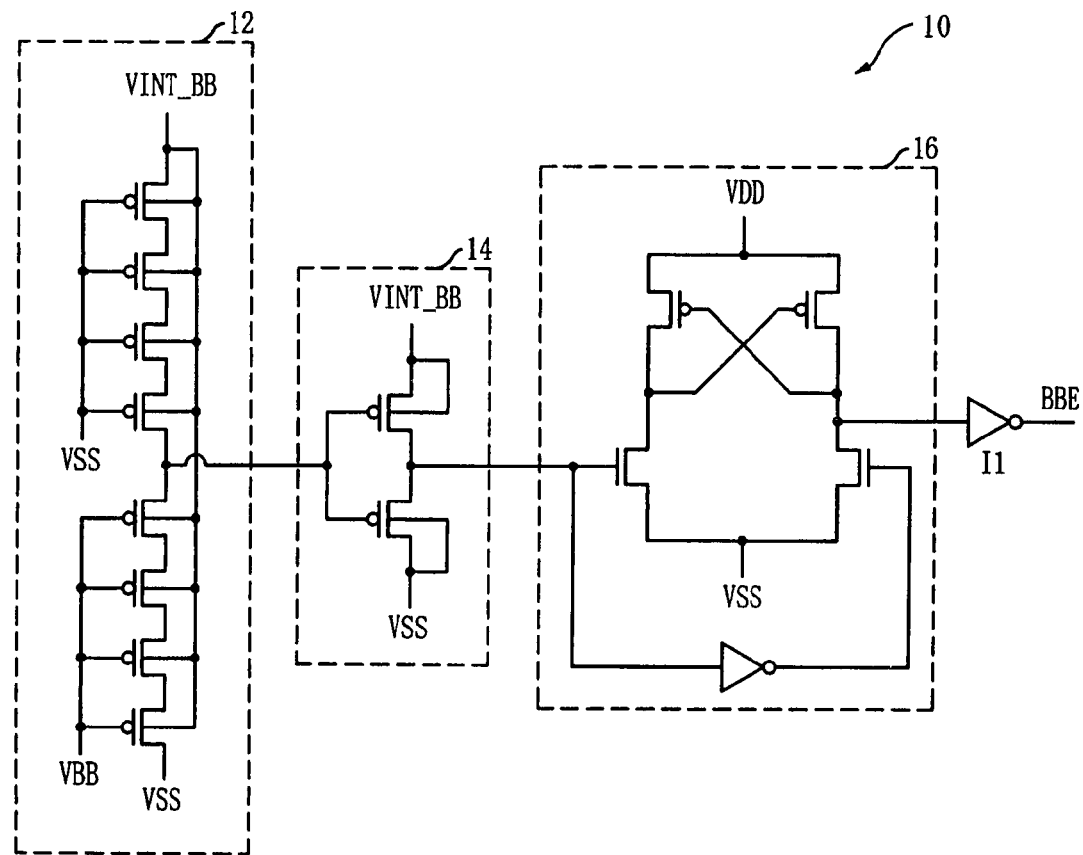
FIG. 3 is an internal circuit diagram of the level sensor of FIG. 2.
Figure 4:
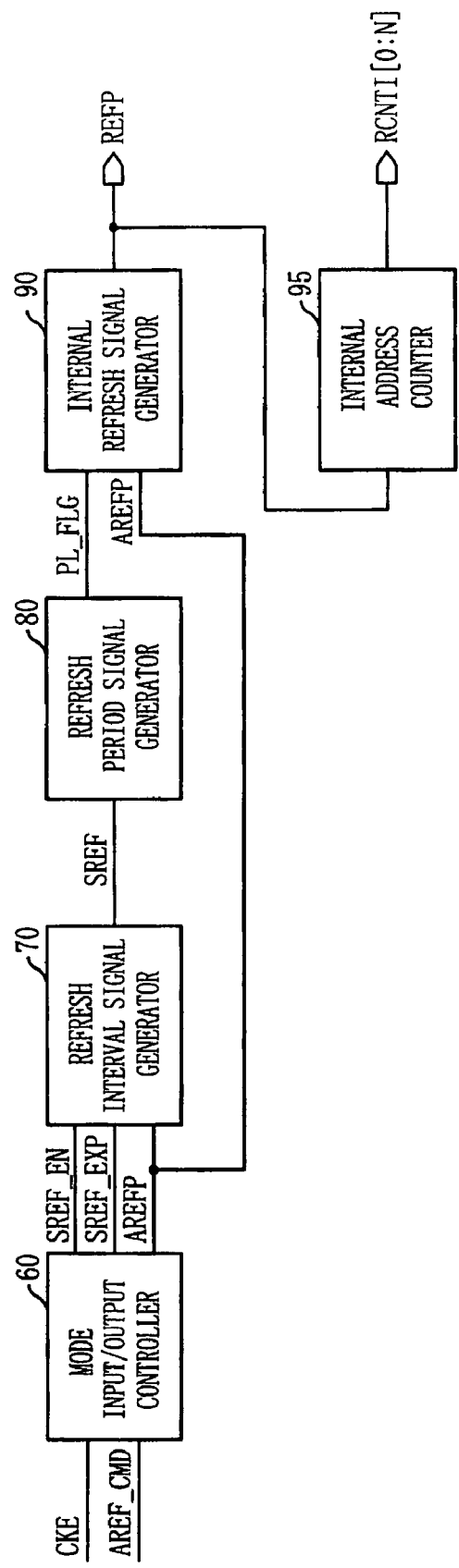
FIG. 4 is a block diagram showing a configuration of a refresh unit in a conventional semiconductor memory device.
Figure 5:
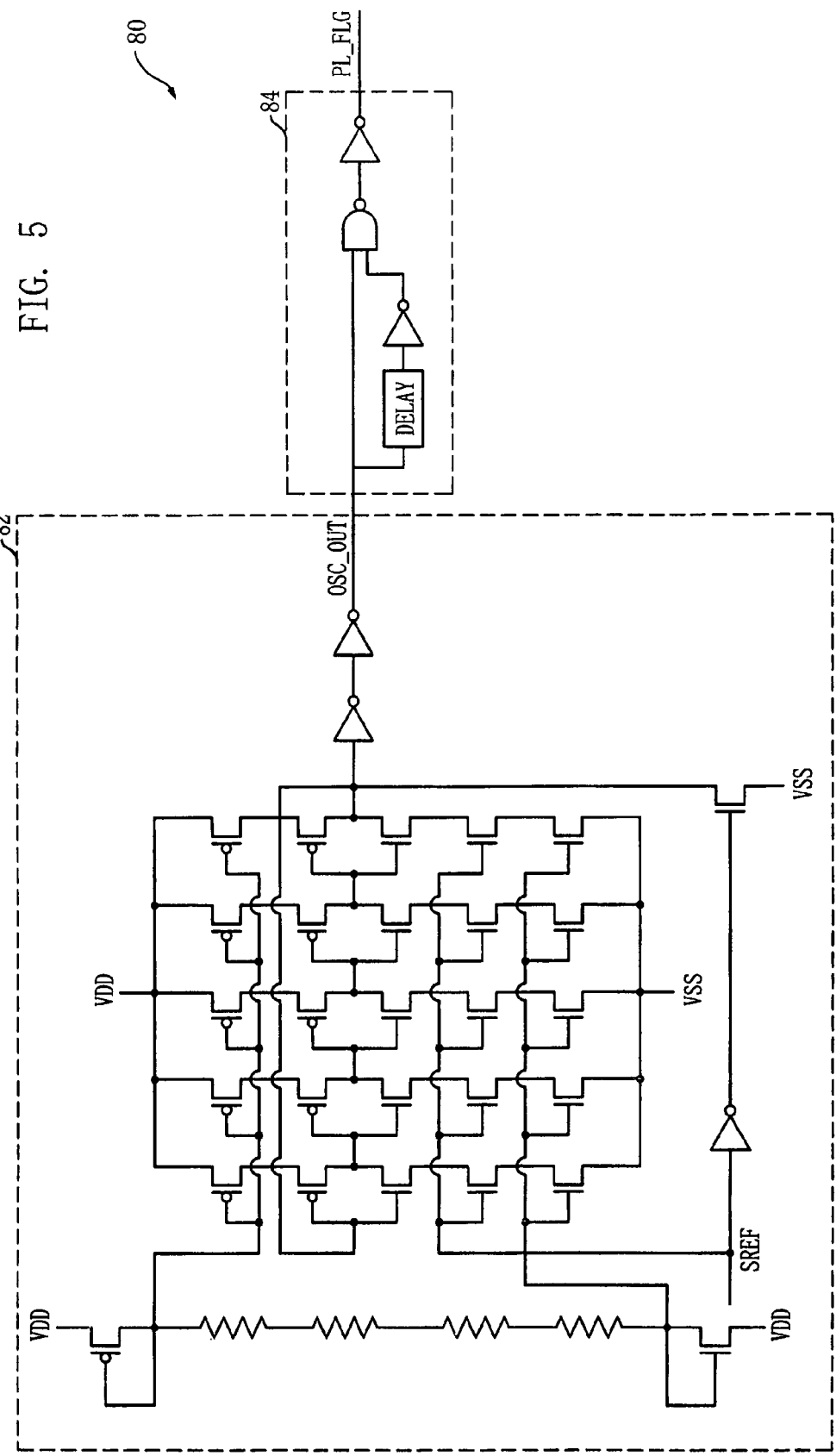
FIG. 5 is an internal circuit diagram of the refresh period signal generator of FIG. 4.
Figure 6:
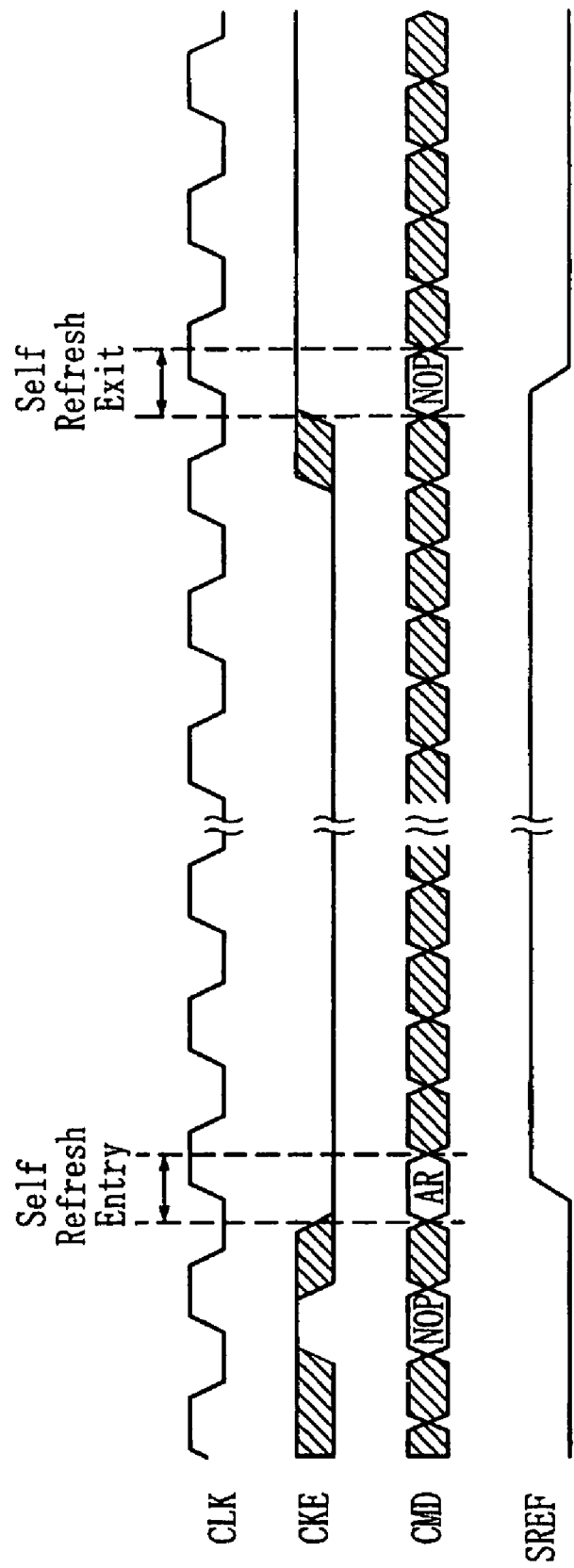
FIG. 6 is an operational waveform diagram of the refresh unit according to the prior art shown in FIGS. 4 and 5.
Figure 7:
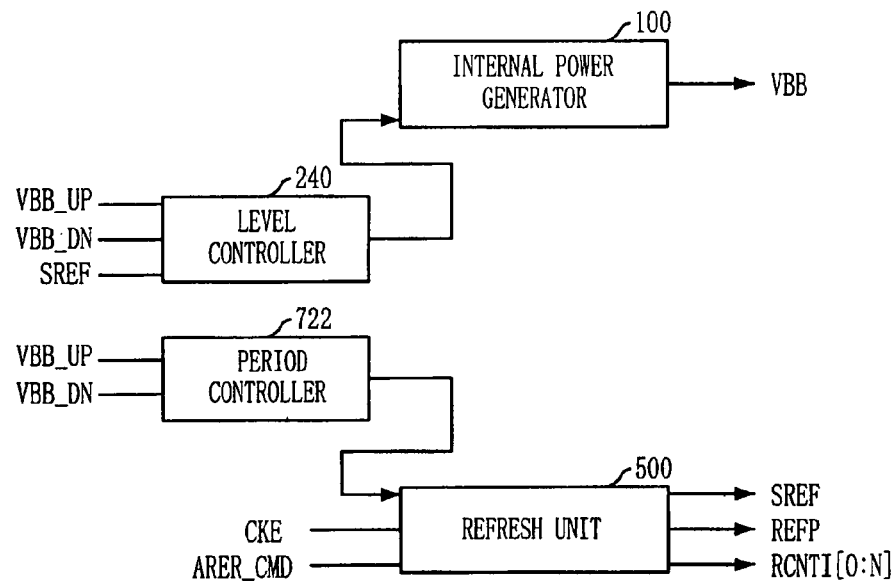
FIG. 7 is a block diagram illustrating a configuration of a semiconductor memory device in accordance with a preferred embodiment of the present invention.

FIG. 7 is a block diagram illustrating a configuration of a semiconductor memory device in accordance with a preferred embodiment of the present invention.

Referring to FIG. 7, the inventive semiconductor memory device includes an internal power generator 100 for negative-pumping an external power to generate an internal power VBB to be applied to a bulk end of cell, a refresh unit 500 for generating an internal refresh signal REFP for refresh driving at regular intervals during a self refresh mode, a level adjustor 240 for adjusting a reference level of the internal power VBB in the self refresh mode, and a period adjustor 722 for adjusting an interval of the internal refresh signal when the level adjustor 240 is driven.

As stated above, the semiconductor memory device of the invention additionally includes the level adjustor 240 adjusts the level of the internal power VBB during the self refresh mode, and adjusts the level of the internal power VBB so that a minimum leakage current is generated from a memory cell during the self refresh mode. Further, the semiconductor memory device additionally includes the period adjustor 722 for adjusting an execution interval of refresh by sensing the level adjustment of the internal power VBB, to thereby reduce the number of times of refresh performed during the self refresh mode. Thus, IDD6, that is, power consumed during the self refresh mode can be reduced.

The following is a detailed description for an internal circuit diagram of each block with reference to the drawings.

Figure 8:
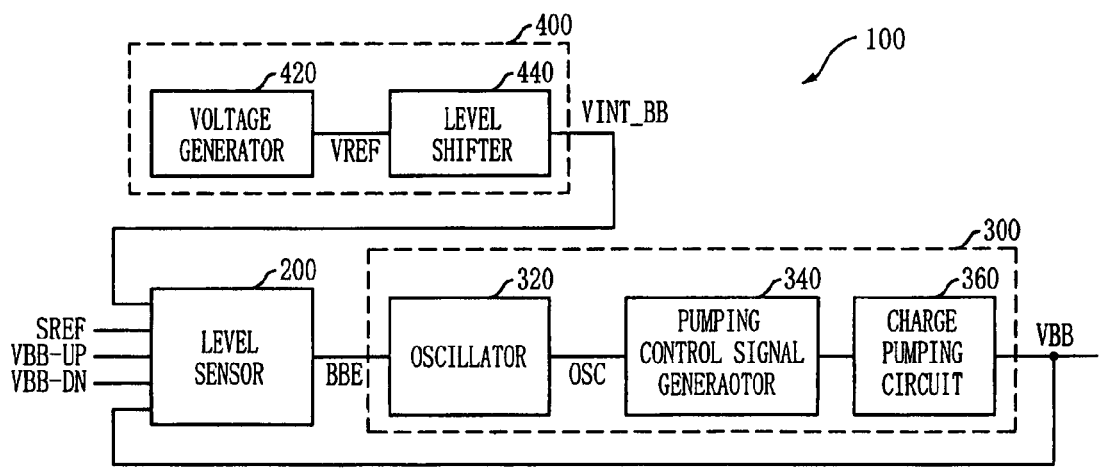
FIG. 8 is an internal circuit diagram of the internal voltage generator of FIG. 7.

FIG. 8 is an internal circuit diagram of the internal voltage generator 100 of FIG. 7.

Referring to FIG. 8, the internal power generator 100 is provided with a level sensor 200 for sensing a level of the internal power VBB corresponding to a level of an adjusted reference voltage VINT_BB during the refresh mode, and a power supplier 300 for negative-pumping an external power VDD under the control of the level sensor 200 to generate the internal power VBB having a level lower than the external power VDD.

More specifically, the power supplier 300 is composed of a charge pumping circuit 360 for negative-pumping the external power VDD to generate the internal power VBB having a level lower than the external power VDD, an oscillator 320 for generating a period signal OSC in response to a sensing signal BBE of the level sensor 200, and a pumping control signal generator 340 for controlling the operation of the charge pumping circuit 360 in response to the period signal OSC.

For reference, the internal power generator 100 is further provided with a reference voltage generator 400 for generating the reference voltage VINT_BB having a stable level regardless of the external power VDD. The reference voltage generator 400 is composed of a voltage generator 420 for producing a target voltage of the internal power VBB and a level shifter 440 for level-shifting an output voltage of the voltage generator 420 to create the reference voltage VINT_BB having a stable level regardless of the external power (power supply voltage) VDD.

Figure 9:
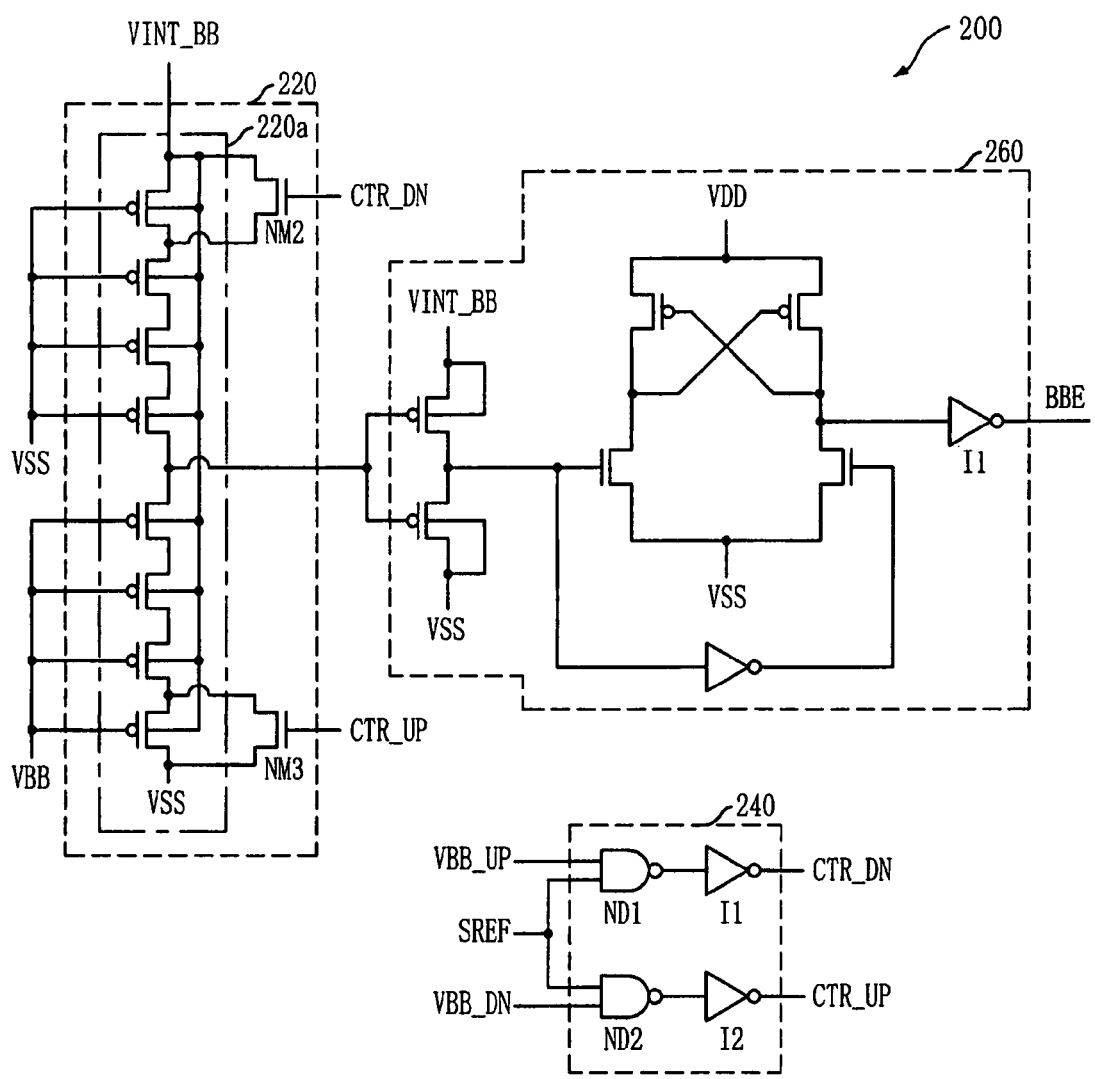
FIG. 9 is an internal circuit diagram of the level sensor of FIG. 8.

FIG. 9 is an internal circuit diagram of the level sensor 200 of FIG. 8.

Referring to FIG. 9, the level sensor 200 is provided with a feedback circuit 220 for providing a level of the internal power VBB on the basis of the reference voltage VINT_BB as a feedback voltage, a level controller 40 for controlling a level of the feedback voltage during the self refresh mode, and a differential amplifier 260 for taking the feedback voltage and its inverted feedback voltage as differential inputs to output the sensing signal BBE.

The level controller 240 is composed of a NAND gate ND1 taking a self refresh interval signal SREF notifying that the current operation is in the self refresh mode and a first level adjustment signal VBB_UPP, an inverter I1 for inverting an output signal of the NAND gate ND1 to provide an up-control signal CRT_UP, a NAND gate ND2 taking the self refresh interval signal SREF and a second level adjustment signal VBB_DN, and an inverter I2 for inverting an output signal of the NAND gate ND2 to output a down-control signal CRT_DN.

The feedback circuit 220 is composed of first to fourth PMOS transistors whose each gate takes a ground voltage VSS and which are connected in series between the reference voltage VINT_BB and an output node, fifth to eighth PMOS transistors whose each gate takes the internal voltage VBB and which are connected in series between the output node and the ground voltage, a first NMOS transistor NM2 whose gate accepts the down-control signal CRT_DN and which is connected in parallel with the first PMOS transistor, and a second NMOS transistor NM3 whose gate receives the up-control signal CRT_UP and which is connected in parallel with the eighth PMOS transistor.

Now, the operation of the level sensor 200 will be briefly described.

First, in the self refresh mode, when the self refresh interval signal SREF notifying that the current operation is in the self refresh mode is activated, the level controller 240 is activated to output any activated one of the first and the second level adjustment signals VBB_UP and VBB_DN as the up- or down-control signal CTR_UP or CTR_DN. Here, if the first level adjustment signal VPP_UP is assumed to be set, the up-control signal CRT_UP is activated.

Then, the second NMOS transistor NM3 in the feedback circuit 220 is activated by the up-control signal CRT_UP, and therefore, although the level of the internal power VBB is the same, the level of the feedback voltage taken at the output end drops. Thus, the point of time at which the sensing signal BBE is activated is higher than that in the normal mode, so that the level of the internal power VBB rises.

Meanwhile, when the down-control signal CTR_DN is activated, the first NMOS transistor NM2 in the feedback circuit 220 is activated and the level of the feedback voltage at the output end rises. Thus, the level of the internal power VBB becomes lower than that in the normal mode.

As mentioned above, the internal power generator 100 including the level sensor 200 adjusts the level of the internal power VBB based on the level adjustment signals VBB_UP and VBB_DN during the refresh mode, and then outputs an adjusted internal power. That is, leakage current can be minimized by adjusting the level of the internal power VBB.

More concretely, in the leakage current generated in the memory cell, an off-current or junction-current has relatively large importance depending on the properties of product. In case an off-current is great, a retention time of cell data can be extended by lowering the level of the internal power VBB through the down-control signal CTR_DN during the refresh. Similarly, in case a junction-current is great, a retention time of cell data can be prolonged by elevating the level of the internal power VBB through the up-control signal CTR_UP.

For reference, the level adjustment signals VBB_UP and VBB_DN are set in the test step of wafer level so that the leakage current can be minimized. After this test procedure, the level-adjustment signals VBB_UP and VBB_DN are set and applied through a fuse option or a metal option.

As described above, the internal power generator adjusts the level of the internal power VBB during the self refresh mode, thereby decreasing leakage current of cell data. Accordingly, the retention time is prolonged.

Meanwhile, if the retention time of data is increased, the number of times of refresh can be decreased during the self refresh mode, thereby reducing IDD6 power consumption.

The following is a description for the refresh unit 500 capable of adjusting the period of the self refresh on the basis of the adjustment of the internal power VBB. For reference, the period adjustor 722 shown in FIG. 7 may be included in the refresh unit.

Figure 10:
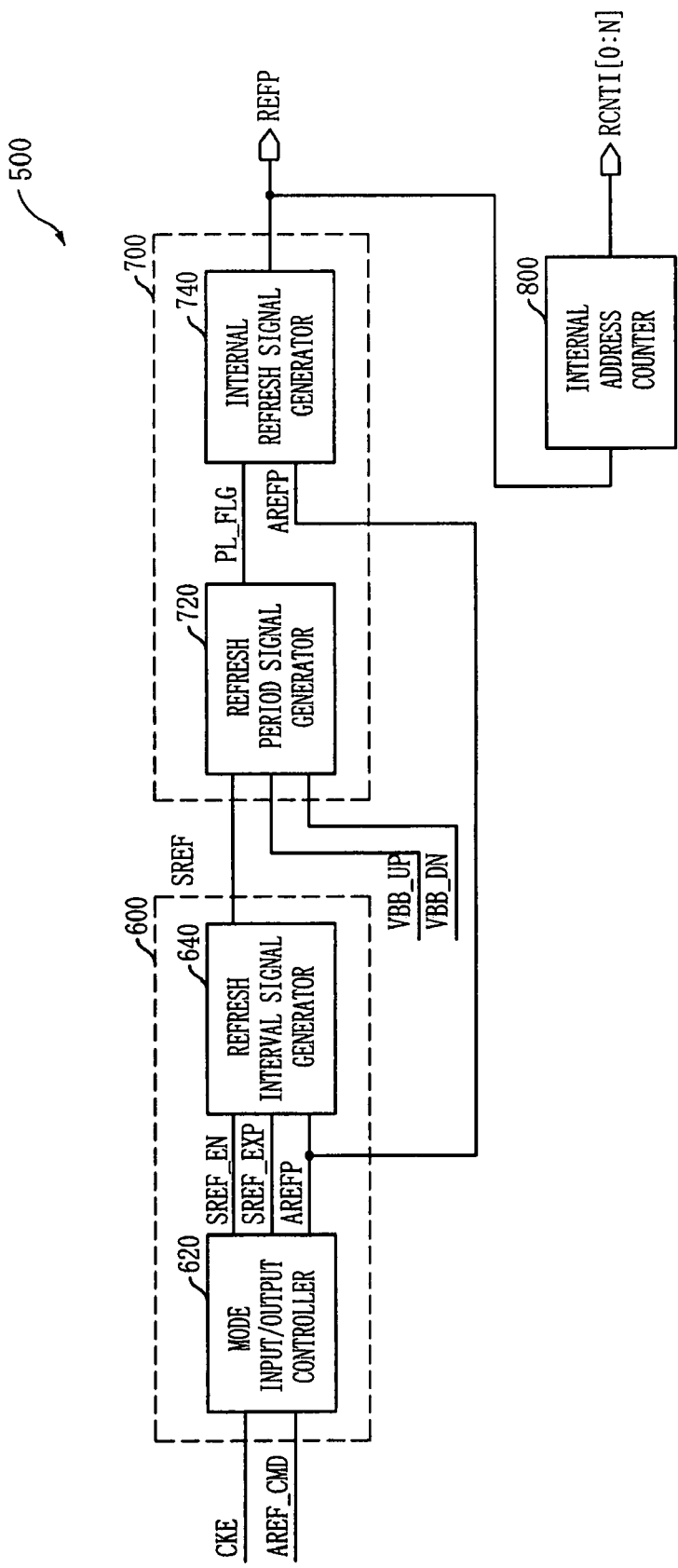
FIG. 10 is an internal circuit diagram of the refresh unit of FIG. 7.

FIG. 10 is an internal circuit diagram of the refresh unit 500 depicted in FIG. 7.

Referring to FIG. 10, the refresh unit 500 includes a refresh exit/entry controller 600 for generating the self refresh interval signal SREF notifying that the current operation is in the self refresh mode and the internal auto refresh signal AREFP in response to the clock enable signal CKE and the auto refresh command AREF_CMD, and a control signal generator 700 for periodically generating an internal refresh signal REFP and an internal address RCNTI[0:N] during activation of the self refresh interval signal SREF, wherein an activation period of the internal refresh signal REFP varies upon a variation of the level of the internal power VBB applied to a memory cell.

To be more specific, the refresh exit/entry controller 600 is provided with a mode input/output controller 620 for taking the clock enable signal CKE and the auto refresh signal AREF_CMD and generating the internal auto refresh signal AREFP, a self refresh entry signal SREF_EN and a self refresh escape signal SREF_EXP, and a refresh interval signal generator 640 for generating the self refresh interval signal SREF notifying a self refresh interval based on the internal auto refresh signal. AREFP, the self refresh entry signal SREF_EN and the self refresh escape signal SREF_EXP.

The control signal generator 700 is provided with a refresh period signal generator 720 for periodically outputting the period pulse signal PL_FLG during activation of the self refresh interval signal SREF of which period is adjusted depending on the level of the internal power, an internal refresh signal generator 740 for activating the internal refresh signal REFP in response to the internal auto refresh signal AREFP and the period pulse signal PL_FLG, and an internal address counter 800 for increasing a row address by one bit unit in response to the internal refresh signal REFP to output the internal address RCNTI[0:N].

As mentioned early, in case there is a variation of the level of the internal power VBB determining the retention time of cell data, the refresh unit 500 of the invention reflects the above and adjusts the period of the internal refresh signal REFP. Thus, the period can be delayed by the retention time of cell data, thereby reducing IDD6 power consumption.

Figure 11:
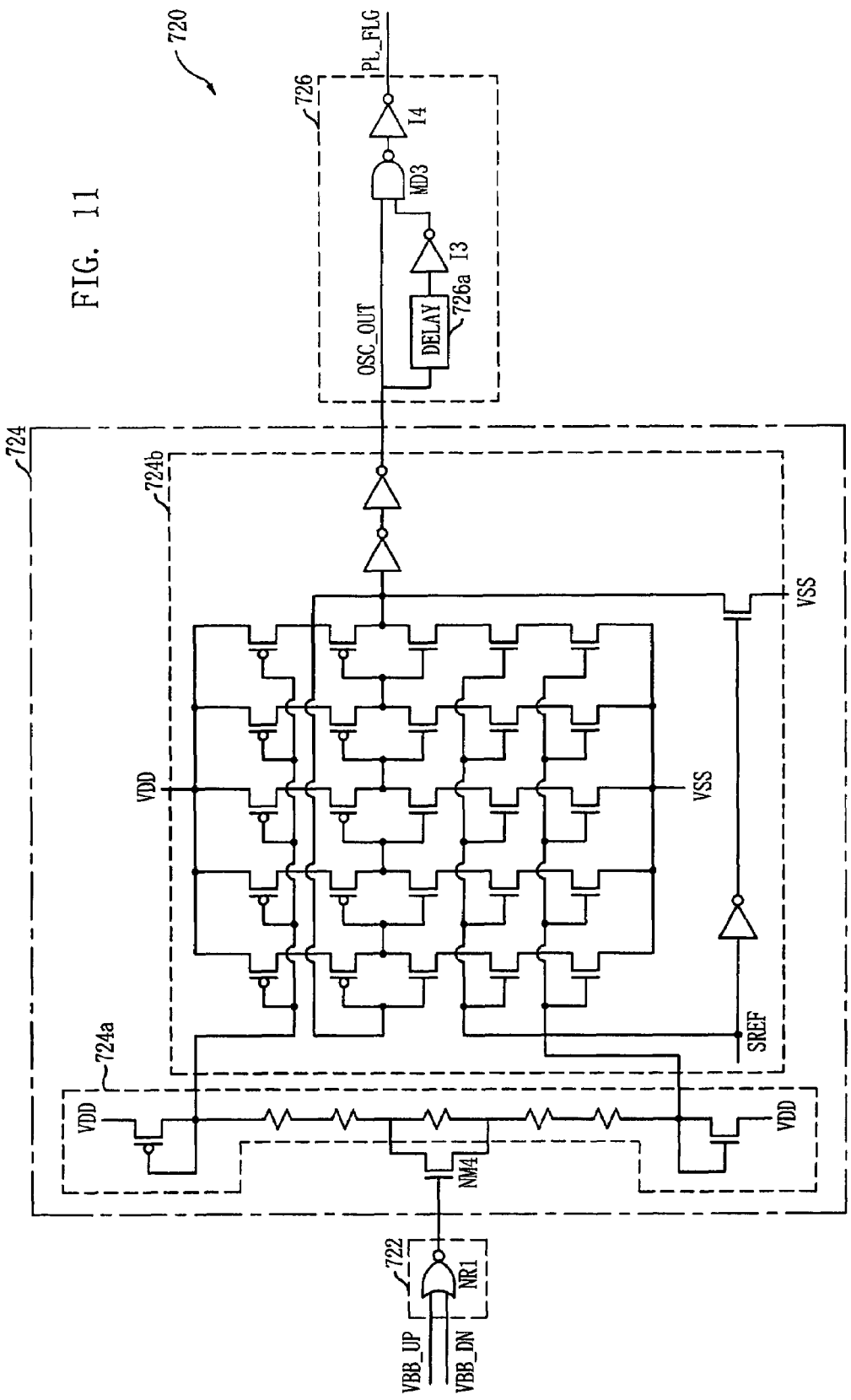
FIG. 11 is an internal circuit diagram of the refresh period signal generator of FIG. 10.

FIG. 11 is an internal circuit diagram of the refresh period signal generator 720 of FIG. 10.

Referring to FIG. 11, the refresh period signal generator 720 is constituted by the period adjustor 722 for generating a period adjustment signal in response to the first and the second level adjustment signals VBB_UP and VBB_DN, an oscillator 724 for adjusting the period of the period signal OSC_OUT during activation of the self refresh interval signal SREF in response to the period adjustment signal, and a pulse generator 726 for generating the period-pulse signal PL_FLG of pulse type from the period signal OSC_OUT.

More specifically, the period adjustor 722 has a NOR gate NR1 for taking the first and the second level adjustment signals VBB_UP and VBB_DN and outputting the period adjustment signal.

The oscillator 724 is provided with a driving voltage supplier 724a for adjusting a level of a driving voltage in response to the period adjustment signal to supply an adjusted driving voltage and an inverter chain 724b for producing the period signal OSC_OUT with a period corresponding to the level of the driving voltage during activation of the self refresh interval signal SREF.

The driving voltage supplier 724a is composed of a plurality of resistors coupled in series between the external voltage VDD and the ground voltage VSS and an NMOS transistor NM4 whose gate receives the period adjustment signal and which is coupled in parallel with one of the plurality of resistors, wherein divided voltages are provided as a first and a second driving voltages.

The pulse generator 726 is composed of a delay circuit 726a for delaying the period signal OSC_OUT, an inverter I3 for inverting an output signal of the delay circuit 726a, a NAND gate ND3 taking an output signal of the inverter I3 and the period signal OSC_OUT, and an inverter I4 for inverting an output signal of the NAND gate ND3 to provide the period pulse signal PL_FLG.

Now, the operation of the refresh period signal generator 720 will be briefly explained.

First, when the first and the second level adjustment signals VBB_UP and VBB_DN are all inactivated, the period adjustment signal is inactivated to a logic high level. Thus, the resistor, which is coupled in parallel with the NMOS transistor NM4 that is under the control of the period adjustment signal in the driving voltage supplier 724a, does not affect the total resistance value.

On the other hand, when one of the first and the second level adjustment signals VBB_UP and VBB_DN is activated, the period adjustor 722 activates the period adjustment signal to a logic low level. Then, the NMOS transistor NM4 in the driving voltage supplier 724a is turned off, which increases the total resistance value by the resistor coupled in parallel with it. Thus, the amount of current supplied from the driving voltage supplier 724a decreases and the period of the period signal OSC_OUT generated by the inverter chain 724b is extended. In succession, the period of the period pulse signal PL_FLG created by the pulse generator 726 is also prolonged.

As such, the increase in period of the period pulse signal PL_FLG means an increase in interval of the internal refresh signal REFP generated in response to it, and a small number of times of refresh is performed.

In other words, the level adjustment signals VBB_UP and VBB_DN are signals that are set to adjust the level of the internal power VBB so that the retention time of cell data is prolonged. Thus, the refresh unit 500 of the invention including the refresh period signal generator 720 senses the state that the internal power VBB is adjusted by the level adjustment signals VBB_UP and VBB_DOWN and the retention time of cell data is prolonged, and then extends the refresh period. The number of times of refresh executed during the self refresh mode is reduced, which decreases IDD6 power consumption.

Therefore, the semiconductor memory device of the invention set forth above adjusts the level of the internal power VBB so that the retention time of cell data is prolonged during the self refresh mode where only the refresh operation is conducted at regular intervals without any commands from outside. Further, in case the level of the internal power VBB is adjusted, the refresh interval is extended, thereby decreasing IDD6 power consumption.

As a result, the present invention adjusts the level of the internal power VBB (bulk voltage applied to cell) so that the retention time of cell data is prolonged during the self refresh mode and thus extends the refresh interval, thereby decreasing power being consumed during the self refresh mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a charge pumping circuit for negative-pumping an external power to generate an internal voltage with a level lower than the external power;
   a level sensor for receiving a self refresh signal and sensing a level of the internal voltage corresponding to a level of an adjusted reference voltage during a refresh mode;
   an oscillator for generating a period signal in response to a sensing signal of the level sensor; and
   a pumping control signal generator for controlling the operation of the charge pumping circuit in response to the period signal.

2. The semiconductor memory device as recited in claim 1, wherein the level sensor includes:
   a feedback circuit for providing a level of the internal voltage on the basis of the level of the adjusted reference voltage as a feedback voltage;
   a level controller for providing control signals for controlling a level of the feedback voltage during the refresh mode; and
   a differential amplifier for taking the feedback voltage and its inverted feedback voltage as differential inputs to output the sensing signal.

3. The semiconductor memory device as recited in claim 2, wherein the level controller includes:
   a first NAND gate taking a self refresh interval signal as the self refresh signal and a first level adjustment signal;
   a first inverter for inverting an output signal of the first NAND gate to output a down-control signal;
   a second NAND gate taking the self refresh interval signal and a second level adjustment signal; and
   a second inverter for inverting an output signal of the second NAND gate to provide an up-control signal.

4. The semiconductor memory device as recited in claim 3, wherein the first and the second level adjustment signals are selected so that a leakage current is minimized in a test step of wafer level, and set by a fuse option or a metal option.

5. The semiconductor memoiy device as recited in claim 4, wherein the feedback circuit includes:
   first to fourth PMOS transistors whose each gate takes a ground voltage and which are connected in series between a reference voltage and an output node;
   fifth to eighth PMOS transistors whose each gate takes the internal voltage and which are connected in series between the output node and the ground voltage;
   a first NMOS transistor whose gate receives the down-control signal and which is connected in parallel with the first PMOS transistor; and a second NMOS transistor whose gate accepts the up-control signal and which is connected in parallel with the eighth PMOS transistor.

6. The semiconductor memory device as recited in claim 5, further comprising a reference voltage generator for generating the reference voltage having a stable level regardless of the external power.

7. A driving method of a semiconductor memory device, comprising:

performing negative-pumping operation to an external power in order to generate a bulk voltage of memory cell;

sensing a level of the bulk voltage in response to an adjusted reference voltage; and controlling the negative-pumping operation so that the bulk voltage has a level corresponding to the adjusted reference voltage, wherein the adjusted reference voltage has a different voltage level for a self refresh mode than a level of the reference voltage for a normal mode.

8. The driving method as recited in claim 7, wherein sensing the level of the bulk voltage includes:

dividing a voltage difference between the bulk voltage and the adjusted reference voltage to produce a feedback voltage;

adjusting a level of the feedback voltage during the self refresh mode; and generating a sensing signal depending on the level of the feedback voltage.

9. The driving method as recited in claim 8, wherein controlling the negative-pumping operation is perfonned by repeating the negative-pumping operation while the sensing signal is enabled.

* * * * *